(12) United States Patent
Subramanian et al.

(10) Patent No.: US 11,677,128 B2
(45) Date of Patent: Jun. 13, 2023

(54) RECONFIGURABLE WIDEBAND HIGH-FREQUENCY CIRCUITS USING NON-RECIPROCAL CIRCULATORS

(71) Applicant: Raytheon Company, Waltham, MA (US)

(72) Inventors: Ajay Subramanian, Nashua, NH (US); Zhaoyang C. Wang, Carlisle, MA (US); Jason C. Soric, North Andover, MA (US); Matthew A. Morton, Lynnfield, MA (US)

(73) Assignee: Raytheon Company, Waltham, MA (US)

( * ) Notice: Subject to any disclaimer, the term of this patent is extended or adjusted under 35 U.S.C. 154(b) by 193 days.

(21) Appl. No.: 17/307,237

(22) Filed: May 4, 2021

(65) Prior Publication Data

US 2021/0384598 A1   Dec. 9, 2021

Related U.S. Application Data

(60) Provisional application No. 63/034,617, filed on Jun. 4, 2020.

(51) Int. Cl.
*H01P 1/38* (2006.01)
*H03H 11/04* (2006.01)
*H01P 1/18* (2006.01)

(52) U.S. Cl.
CPC .............. *H01P 1/38* (2013.01); *H01P 1/18* (2013.01); *H03H 11/04* (2013.01); *H03H 2011/0488* (2013.01)

(58) Field of Classification Search
CPC .. H01P 1/38; H01P 1/383; H01P 1/387; H01P 1/39; H01P 1/393; H01P 1/397; H01P 1/32; H01P 1/36; H01P 1/365; H01P 1/37; H01P 1/375; H01P 1/18; H01P 1/19; H01P 1/181; H03H 11/04
See application file for complete search history.

(56) References Cited

U.S. PATENT DOCUMENTS

| 6,226,425 B1 | 5/2001 | Chang-Hasnain et al. |
| 9,536,512 B2 | 1/2017 | Alu et al. |
| 9,887,862 B2 | 2/2018 | Zhou et al. |

(Continued)

FOREIGN PATENT DOCUMENTS

| JP | H0275801 U | 6/1990 |
| JP | 2005268898 A | 9/2005 |

(Continued)

OTHER PUBLICATIONS

Non-Final Office Action dated Mar. 15, 2022 in connection with U.S. Appl. No. 17/307,261, 6 pages.

(Continued)

*Primary Examiner* — Stephen E. Jones

(57) ABSTRACT

A method includes receiving a radio frequency (RF) input signal using at least one non-reciprocal circulator. The method also includes generating an RF output signal using at least one of one or more reflective circuit elements. Each reflective circuit element is configured to receive an RF signal from the at least one non-reciprocal circulator and to provide a modified RF signal to the at least one non-reciprocal circulator. The RF output signal represents the RF input signal as modified by the at least one of the one or more reflective circuit elements.

20 Claims, 7 Drawing Sheets

(56) References Cited

U.S. PATENT DOCUMENTS

| | | | |
|---|---|---|---|
| 10,581,135 | B2 | 3/2020 | Reiskarimian et al. |
| 10,673,407 | B2 | 6/2020 | Rinaldi et al. |
| 11,456,515 | B2 | 9/2022 | Wang et al. |
| 2011/0174078 | A1 | 7/2011 | Chinn et al. |
| 2012/0299789 | A1 | 11/2012 | Orban et al. |
| 2013/0321091 | A1 | 12/2013 | Nishida et al. |
| 2017/0212367 | A1 | 7/2017 | Alu et al. |
| 2019/0305397 | A1 | 10/2019 | Dinc et al. |
| 2019/0372190 | A1 | 12/2019 | Kord et al. |
| 2020/0412519 | A1 | 12/2020 | Krishnaswamy et al. |

FOREIGN PATENT DOCUMENTS

| | | | |
|---|---|---|---|
| JP | 2008002947 | A | 1/2008 |
| WO | 2016/047218 | A1 | 3/2016 |
| WO | 2020036669 | A2 | 2/2020 |
| WO | 2020150745 | A1 | 7/2020 |

OTHER PUBLICATIONS

Fettweis, "Some Properties of Pulse Impedances and Pulse Impedance Matrices", Nov. 1970, 8 pages.

Bruckmann, "Circulator Reference Structures for Switched Capacitor and Digital Filter Design", AEU Int J. Electron Commun., vol. 51, No. 5, Sep. 1997, 8 pages.

Peregrine Semiconductor, "Product Specification PE64102", Jan. 2012, 14 pages.

Fettweis, "Realization of General Network Functions Using the Resonant-transfer Principle", Jun. 1971, 10 pages.

International Search Report dated Aug. 25, 2021 in connection with International Patent Application No. PCT/US2021/030974, 4 pages.

Written Opinion of the International Searching Authority dated Aug. 25, 2021 in connection with International Patent Application No. PCT/US2021/030974, 8 pages.

International Search Report and Written Opinion of the International Searching Authority dated Aug. 31, 2021 in connection with International Patent Application No. PCT/US2021/030977, 57 pages.

Nagulu et al., "Ultra Compact, Ultra Wideband, DC-1 GHz CMOS Circulator Based on Quasi-Electrostatic Wave Propagation in Commutated Switched Capacitor Networks", 2020 IEEE Radio Frequency Integrated Circuits Symposium, 2020, 4 pages.

Reiskarimian et al., "Magnetic-free non-reciprocity based on staggered commutation", Nature Communications, Apr. 2016, 10 pages.

Wang et al., U.S. Appl. No. 17/307,261 titled "Reconfigurable Wideband High-Frequency Filter Using Mon-Reciprocal Circulator" filed May 4, 2021, 29 pages.

Notice of Allowance dated Dec. 14, 2022 in connection with Israeli Patent Application No. 298423, 4 pages.

RECONFIGURABLE WIDEBAND HIGH-FREQUENCY CIRCUITS USING NON-RECIPROCAL CIRCULATORS

CROSS-REFERENCE TO RELATED APPLICATION AND PRIORITY CLAIM

This application claims priority under 35 U.S.C. § 119(e) to U.S. Provisional Patent Application No. 63/034,617 filed on Jun. 4, 2020.

TECHNICAL FIELD

This disclosure relates generally to communication systems. More specifically, this disclosure relates to reconfigurable wideband high-frequency circuits using non-reciprocal circulators.

BACKGROUND

Wireless communication systems have become ubiquitous in today's society. In some cases, a wireless communication system needs to have the ability to operate effectively over a wide range of operating frequencies. For example, various microwave communication systems may use frequencies in the range of 300 MHz to 300 GHz, and any individual microwave communication system may need to use frequencies within a wide subset of that frequency range.

SUMMARY

This disclosure relates to reconfigurable wideband high-frequency circuits using non-reciprocal circulators.

In a first embodiment, a system includes at least one non-reciprocal circulator and one or more reflective circuit elements. Each reflective circuit element is configured to receive a radio frequency (RF) signal from the at least one non-reciprocal circulator and to provide a modified RF signal to the at least one non-reciprocal circulator.

In a second embodiment, a method includes receiving an RF input signal using at least one non-reciprocal circulator. The method also includes generating an RF output signal using at least one of one or more reflective circuit elements. Each reflective circuit element is configured to receive an RF signal from the at least one non-reciprocal circulator and to provide a modified RF signal to the at least one non-reciprocal circulator. The RF output signal represents the RF input signal as modified by the at least one of the one or more reflective circuit elements.

In a third embodiment, a non-transitory computer readable medium contains instructions that when executed cause at least one controller to reconfigure a system having at least one non-reciprocal circulator and multiple reflective circuit elements. Each reflective circuit element is configured to receive an RF signal from the at least one non-reciprocal circulator and to provide a modified RF signal to the at least one non-reciprocal circulator. The instructions that cause the at least one controller to reconfigure the system include instructions that cause the at least one controller to change a sequence of non-overlapping pulses in control signals provided to multiple switches of each non-reciprocal circulator in order to selectively control which of the reflective circuit elements is conductively coupled to the at least one non-reciprocal circulator.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
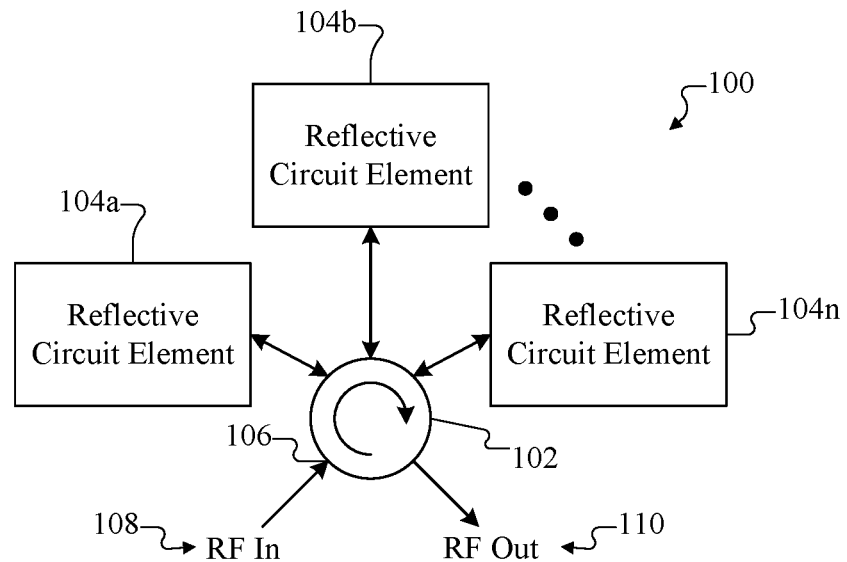
FIG. 1 illustrates an example non-reciprocal circulator-based circuit according to this disclosure.

FIGS. 1 through 9, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, wireless communication systems have become ubiquitous in today's society. In some cases, a wireless communication system needs to have the ability to operate effectively over a wide range of operating frequencies. For example, various microwave communication systems may use frequencies in the range of 300 MHz to 300 GHz, and any individual microwave communication system may need to use frequencies within a wide subset of that frequency range. As a particular example, a microwave communication system may need to be reconfigurable to operate or sweep over a frequency range of about 2 GHz to about 18 GHz. Often times, this requires that the communication system include different phase shifters, baluns, isolators, transceivers, or other circuit components that can be used at different times to handle different frequencies.

This disclosure provides various non-reciprocal circulator-based circuits that can be used to provide reconfigurable wideband high-frequency functionality, such as reconfigurable wideband high-frequency phase shifters, baluns, isolators, and transceivers. These circuits can be used in microwave frontends or other larger systems.

As described in more detail below, some of the circulator-based circuits generally include at least one non-reciprocal circulator and one or more reflective circuit elements (such as one or more reflective phase delay elements, reflective attenuators, or other reflective elements) coupled to the non-reciprocal circulator(s). A non-reciprocal circulator can receive a radio frequency (RF) input signal and provide the RF input signal to a first reflective circuit element, which can reflect the RF input signal as a modified RF signal back to the non-reciprocal circulator. If desired, the modified RF signal can be provided to a second reflective circuit element, which can reflect the modified RF signal as a twice-modified RF signal back to the non-reciprocal circulator. The non-reciprocal circulator can provide an RF output signal having one or more desired characteristics based on the modification(s) provided by the reflective circuit element(s). The reflective circuit element or elements used to modify the RF input signal can vary as needed or desired, and different reflective circuit elements can be used over time to modify the RF input signal in different ways over time.

Others of the circulator-based circuits generally include at least one non-reciprocal circulator that is controlled to provide isolation functionality. The isolation functionality here may be implemented without the use of any reflective circuit elements. However, as described below, the circulator-based circuits can be reconfigurable in that the reflective circuit elements used with at least one non-reciprocal circulator can be controllable. Thus, it may be possible to reconfigure a circulator-based circuit that is currently using one or more reflective circuit elements so that the circulator-based circuit provides isolation functionality. It may also be possible to reconfigure a circulator-based circuit that is currently providing isolation functionality so that the circulator-based circuit uses one or more reflective circuit elements to perform another function.

Depending on the implementation, various circulator-based circuits disclosed here can be highly reconfigurable and highly linear, such as through the use of gallium nitride (GaN) implementations. Also, in some cases, at least some of the reflective circuit elements can be selectively connected to and disconnected from the non-reciprocal circulator in order to provide desired functionality. In this way, the circulator-based circuits can be used to implement reconfigurable wideband high-frequency functions as needed or desired in a wireless communication system or other system.

These circulator-based circuits may be used in any number of applications to support high-power or other wireless communications or other functionality. For example, the circulator-based circuits may be used in so-called "5G" base stations or other high-power base stations. As other examples, these circulator-based circuits may be used to replace a variety of RF frontends in various devices or implemented as transmit/receive module integrated circuits. Note, however, that the circulator-based circuits may be used in any other suitable manner.

FIG. 1 illustrates an example non-reciprocal circulator-based circuit 100 according to this disclosure. As shown in FIG. 1, the circuit 100 generally includes at least one non-reciprocal circulator 102 and one or more reflective circuit elements 104a-104n coupled to the non-reciprocal circulator(s) 102. Depending on the implementation, the circuit 100 may include a single non-reciprocal circulator 102 or multiple non-reciprocal circulators 102. Also, any suitable number(s) and type(s) of reflective circuit elements 104a-104n may be coupled to each non-reciprocal circulator 102. In addition, if multiple non-reciprocal circulators 102 are present, the number(s) and type(s) of reflective circuit elements 104a-104n coupled to the non-reciprocal circulators 102 may be the same or different.

Each non-reciprocal circulator 102 includes multiple input/output (I/O) ports 106, where each I/O port is configured to receive an RF signal and/or provide an RF signal. Each non-reciprocal circulator 102 is also configured to allow an RF signal received at one port 106 to travel in one direction (clockwise in this particular example) and be output through the next enabled or active port. In this example, the non-reciprocal circulator 102 receives an RF input signal 108 at a first port 106, and the RF input signal 108 may be output through a second port to the first reflective circuit element 104a. The non-reciprocal circulator 102 may also receive an input signal at the second port 106 (which represents a modified version of the signal previously output through the second port 106), and the input signal may be output through a third port to the second reflective circuit element 104b. A final port 106 provides an RF output signal 110. Note here that one, some, or all of the reflective circuit elements 104a-104n may be used to convert the RF input signal 108 into the RF output signal 110, or all of the reflective circuit elements 104a-104n may be disconnected from the non-reciprocal circulator 102 so that the non-reciprocal circulator 102 can be controlled to function as an isolator.

The non-reciprocal circulator 102 includes any suitable structure configured to allow RF signals to circulate between different inputs and outputs in a non-reciprocal manner. The phrase "non-reciprocal" indicates that forward and reverse signals (meaning incoming and outgoing signals) at the same port traverse different paths, which helps to permit movement of the signals in a clockwise or counter-clockwise direction (but not both). In some embodiments, the non-reciprocal circulator 102 represents a field effect transistor (FET) or other transistor-based non-reciprocal circulator. One example implementation of the non-reciprocal circulator 102 is described in Nagulu et al., "Ultra Compact, Ultra Wideband, DC-1 GHz CMOS Circulator Based on Quasi-Electrostatic Wave Propagation in Commutated Switched Capacitor Networks," 2020 IEEE Radio Frequency Integrated Circuits Symposium, August 2020, pages 55-58 (which is hereby incorporated by reference in its entirety).

Each of the reflective circuit elements 104a-104n is configured to modify the RF signal traversing through the non-reciprocal circulator 102 and to provide the modified signal back to the non-reciprocal circulator 102. The exact makeup and functionality of the reflective circuit elements 104a-104n can vary depending on the implementation. For example, in some cases, the RF input signal 108 passes through all of the reflective circuit elements 104a-104n sequentially in order to achieve a desired signal modification and produce a desired RF output signal 110. In other cases, the RF input signal 108 passes through one or some (but not all) of the reflective circuit elements 104a-104n sequentially in order to achieve a desired signal modification and produce a desired RF output signal 110, and the reflective circuit elements 104a-104n that are used to modify the RF input signal 108 can be controlled (such as based on the frequency of the RF input signal 108 or the RF output signal 110 and/or the desired signal modification). As a particular example, transistor switches or other devices may be used to selectively block or allow passage of an RF signal between the non-reciprocal circulator 102 and each of the reflective circuit elements 104a-104n. Each of the reflective circuit elements 104a-104n may be said to represent a different "branch" of the circuit 100.

Each of the reflective circuit elements 104a-104n includes any suitable structure configured to modify an RF signal from the non-reciprocal circulator 102 and to provide the modified RF signal back to the non-reciprocal circulator 102. Example implementations of the reflective circuit elements 104a-104n are provided below, where the reflective circuit elements 104a-104n are used to implement circuits such as programmable phase shifters, programmable attenuators, and baluns. However, the reflective circuit elements 104a-104n may be used to provide any other desired functionality.

Although FIG. 1 illustrates one example of a non-reciprocal circulator-based circuit 100, various changes may be made to FIG. 1. For example, each non-reciprocal circulator 102 may have any suitable number of ports 106 and be coupled to any suitable number of reflective circuit elements 104a-104n. Also, various components in FIG. 1 may be combined, further subdivided, replicated, omitted, or rearranged and additional components may be added according to particular needs.

Figure 2:
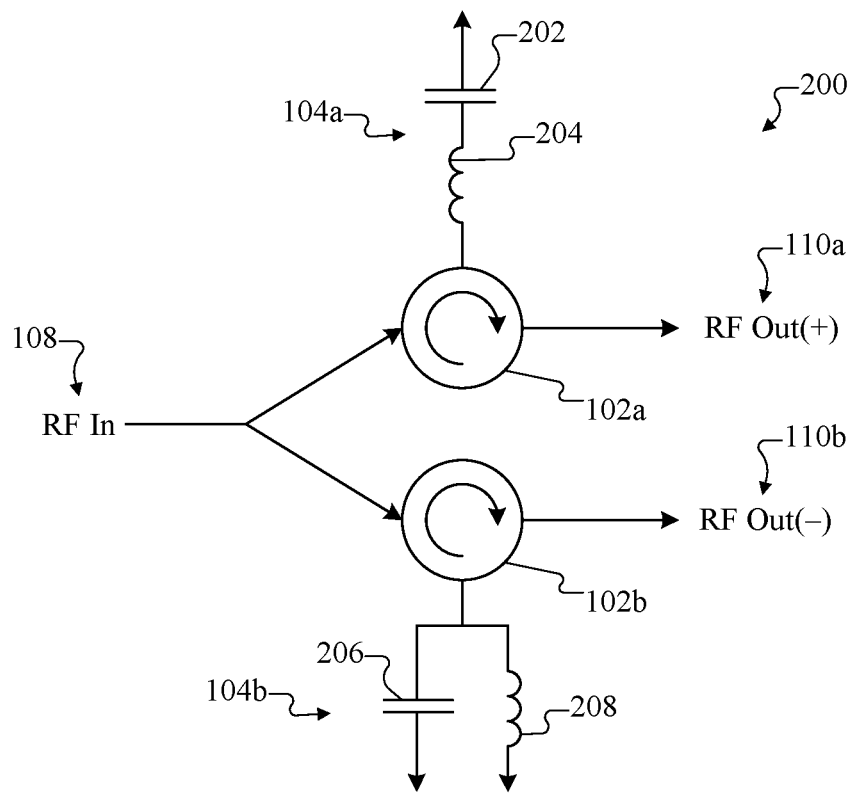
FIG. 2 illustrates an example non-reciprocal circulator-based circuit supporting a balun function according to this disclosure.

FIG. 2 illustrates an example non-reciprocal circulator-based circuit 200 supporting a balun function according to this disclosure. As shown in FIG. 2, the circuit 200 includes two non-reciprocal circulators 102a-102b and two reflective circuit elements 104a-104b. The non-reciprocal circulator 102a is configured to receive a portion of the RF input signal 108 and provide the portion of the RF input signal 108 to a phase delay element implemented using a capacitor 202 coupled in series with an inductor 204 in the reflective circuit element 104a. The phase-shifted RF signal is output as a first RF output signal 110a via the non-reciprocal circulator 102a. The non-reciprocal circulator 102b is configured to receive another portion of the RF input signal 108 and provide the portion of the RF input signal 108 to another phase delay element implemented using a capacitor 206 coupled in series with an inductor 208 in the reflective circuit element 104b. The phase-shifted RF signal is output as a second RF output signal 110b via the non-reciprocal circulator 102b.

Each capacitor 202, 206 includes any suitable capacitive structure providing any suitable capacitance. Each inductor 204, 208 includes any suitable inductive structure providing any suitable inductance. The specific values of the capacitances and inductances here can vary based on the desired frequency responses of the reflective circuit elements 104a-104b. In some embodiments of the circuit 200, the non-reciprocal circulators 102a-102b may each have a loss of about 0.1 dB and may together provide about 20 dB of isolation between the RF output signals 110a-110b. However, other embodiments may provide different losses and isolation levels.

During operation, the circuit 200 can produce two RF output signals 110a-110b that have substantially equal amplitudes and a phase difference of substantially 180°. The substantially equal amplitudes can be achieved by splitting the RF input signal 108 into substantially equal portions and ensuring that the non-reciprocal circulators 102a-102b and the reflective circuit elements 104a-104b provide substantially equal signal amplitude attenuations. The phase difference of substantially 180° can be achieved by designing the reflective circuit elements 104a-104b to provide relative phase shifts so that the total phase difference between the RF output signals 110a-110b is approximately 180°.

Although FIG. 2 illustrates one example of a non-reciprocal circulator-based circuit 200 supporting a balun function, various changes may be made to FIG. 2. For example, each reflective circuit element 104a-104b may include any suitable type(s) of phase shifting element(s). As long as the phase shift difference of the reflective circuit elements 104a and 104b is substantially 180° and the signal amplitude attenuation of the non-reciprocal circulators 102a-102b and the reflective circuit elements 104a-104b is substantially equal, a differential RF signal can be created by the RF output signals 110a-110b to support a balun function. In addition, various components in FIG. 2 may be combined, further subdivided, replicated, omitted, or rearranged and additional components may be added according to particular needs.

Figure 3:
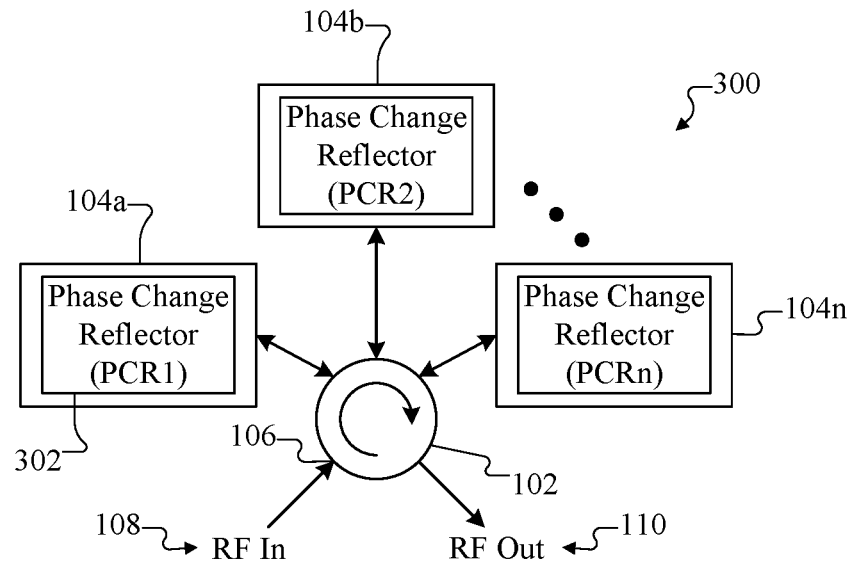
FIG. 3 illustrates an example non-reciprocal circulator-based circuit supporting wideband reconfigurable phase shifting according to this disclosure.

FIG. 3 illustrates an example non-reciprocal circulator-based circuit 300 supporting wideband reconfigurable phase shifting according to this disclosure. As shown in FIG. 3, the circuit 300 includes the non-reciprocal circulator 102 and the reflective circuit elements 104a-104n. Here, each of the reflective circuit elements 104a-104n implements a different phase change reflector (PCR) 302, where each phase change reflector 302 is configured to change the phase of an RF signal from the non-reciprocal circulator 102 and to reflect the modified RF signal back to the non-reciprocal circulator 102. Essentially, the reflective circuit elements 104a-104n here are functioning as "phase change" reflectors since they are changing the phase of the RF input signal 108. Each phase change reflector 302 includes any suitable structure configured to provide reflection with a phase shift, such as an inductor-capacitor (LC) circuit or a transmission line.

Each of the reflective circuit elements 104a-104n may provide any suitable amount of phase delay. In some cases, the reflective circuit elements 104a-104n all provide different amounts of phase delay. Using this circuit 300, a desired phase change can be obtained to meet the particular needs of a frontend system or other system. For example, transistor switches or other devices may be used to allow the RF input signal 108 to pass through one or more of the phase change reflectors 302 in one or more of the reflective circuit elements 104a-104n, and the particular phase change reflectors 302 and reflective circuit elements 104a-104n used at any given time can vary based on the desired phase change. In other words, the RF input signal 108 can be controllably passed through one or more branches of the circuit 300 in order to obtain the desired phase change. Moreover, the one or more branches of the circuit 300 that are used to modify the RF input signal 108 can change over time, such as when the transistor switches or other devices are controlled to change the reflective circuit elements 104a-104n that are used to provide phase shifts to the RF input signal 108 over time. As a result, the circuit 300 can be used to create a wideband programmable phase shifter that is able to operate over a wide range of desired phase changes. In addition, none of the reflective circuit elements 104a-104n may be used to process the RF input signal 108 at a specified time, in which case the circuit 300 may function as an isolator as described below.

Although FIG. 3 illustrates one example of a non-reciprocal circulator-based circuit 300 supporting wideband reconfigurable phase shifting, various changes may be made to FIG. 3. For example, the non-reciprocal circulator 102 may have any suitable number of ports 106 and be coupled to any suitable number of reflective circuit elements 104a-104n, and each reflective circuit element 104a-104n may include any suitable type(s) of phase change reflector(s). Also, it is possible for some of the reflective circuit element 104a-104n to include non-phase-related components. In addition, various components in FIG. 3 may be combined, further subdivided, replicated, omitted, or rearranged and additional components may be added according to particular needs.

Figure 4:
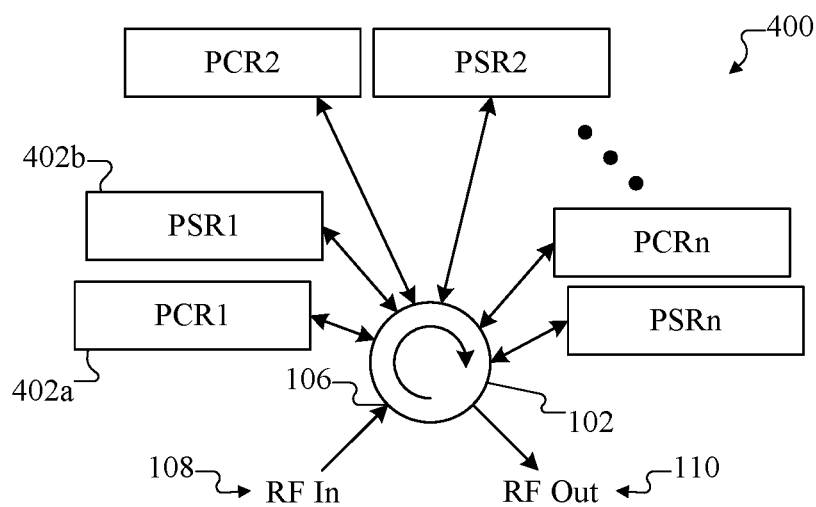
FIG. 4 illustrates another example non-reciprocal circulator-based circuit supporting wideband reconfigurable phase shifting according to this disclosure.

FIG. 4 illustrates another example non-reciprocal circulator-based circuit 400 supporting wideband reconfigurable phase shifting according to this disclosure. As shown in FIG. 4, the circuit 400 includes the non-reciprocal circulator 102, and the reflective circuit elements 104a-104n are implemented using reference phase change reflectors 402a and phase shift reflectors (PSRs) 402b. An RF signal can be selectively passed through one of the reference phase change reflectors 402a and one of the phase shift reflectors 402b to obtain a desired phase shift (where the phase shift is defined by the phase shift difference between two reflectors 402a and 402b). Wideband phase shifting can be achieved using this type of relative phase change. Each phase change reflector 402a and each phase shift reflector 402b includes any suitable structure configured to provide reflection with phase shift, such as an LC circuit or a transmission line.

Each pair of one reference phase change reflector 402a and one phase shift reflector 402b may provide any suitable amount of phase delay. In some cases, the different pairs of reference phase change reflectors 402a and phase shift reflectors 402b all provide different amounts of phase delay. Using this circuit 400, a desired phase change can be obtained to meet the particular needs of a frontend system or other system. For example, transistor switches or other devices may be used to allow the RF input signal 108 to pass through one or more pairs of reflectors 402a-402b, and the particular pair(s) of reflectors 402a-402b used at any given time can vary based on the desired phase change. In other words, the RF input signal 108 can be controllably passed through one or more branches of the circuit 400 in order to obtain the desired phase change. Moreover, the one or more branches of the circuit 400 that are used to modify the RF input signal 108 can change over time, such as when the transistor switches or other devices are controlled to change the pairs of reflectors 402a-402b that are used to provide phase shifts to the RF input signal 108 over time. As a result, the circuit 400 can be used to create a wideband programmable phase shifter that is able to operate over a wide range of desired phase changes. In some cases, the circuit 400 may produce less phase and amplitude errors compared to the circuit 300, although the errors can vary based on the implementation. In addition, none of the reflectors 402a-402b may be used to process the RF input signal 108 at a specified time, in which case the circuit 400 may function as an isolator as described below.

Although FIG. 4 illustrates another example of a non-reciprocal circulator-based circuit 400 supporting wideband reconfigurable phase shifting, various changes may be made to FIG. 4. For example, the non-reciprocal circulator 102 may have any suitable number of ports 106 and be coupled to any suitable number of reflective circuit elements 104a-104n, and each reflective circuit element 104a-104n may include any suitable type(s) of phase change or shift reflector(s). Also, it is possible for some of the reflective circuit element 104a-104n to include non-phase-related components. In addition, various components in FIG. 4 may be combined, further subdivided, replicated, omitted, or rearranged and additional components may be added according to particular needs.

Figure 5:
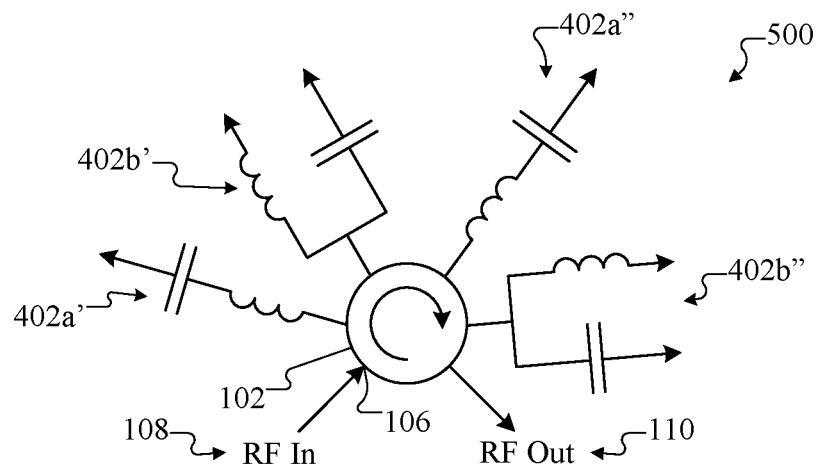
FIG. 5 illustrates a specific example implementation of a non-reciprocal circulator-based circuit supporting wideband reconfigurable phase shifting according to this disclosure.

FIG. 5 illustrates a specific example implementation of a non-reciprocal circulator-based circuit 500 supporting wideband reconfigurable phase shifting according to this disclosure. In this particular implementation of a reconfigurable phase shifter, the circuit 500 includes a reference phase change reflector 402a', a phase shift reflector 402b', a reference phase change reflector 402a", and a phase shift reflector 402b". The phase change reflector 402a' is implemented using a capacitor and an inductor coupled in series, and the phase shift reflector 402b' is implemented using a capacitor and an inductor coupled in parallel. Also, the phase change reflector 402a" is implemented using a capacitor and an inductor coupled in series, and the phase shift reflector 402b" is implemented using a capacitor and an inductor coupled in parallel.

Each capacitor includes any suitable capacitive structure providing any suitable capacitance, and each inductor includes any suitable inductive structure providing any suitable inductance. The specific values of the capacitances and inductances here can vary based on the desired phase shifting by the reflectors 402a', 402b', 402a", 402b" of the reflective circuit elements 104a and 104b.

In this example, the circuit 500 implements a multi-step phase shifter using LC reflectors. In some embodiments, for example, the reflectors 402a' and 402b' may be used to provide a 90° phase shift, and the reflectors 402a" and 402b" may be used to provide a 180° phase shift. Thus, the circuit 500 can be programmed to provide a phase shift of 0° (by passing a signal through the reflectors 402a', 402a" and skipping the reflectors 402b', 402b"), 90° (by passing a signal through the reflectors 402b', 402a" and skipping the reflectors 402a', 402b"), 180° (by passing a signal through the reflectors 402a', 402b" and skipping the reflectors 402a", 402b'), or 270° (by passing a signal through the reflectors 402a", 402b" and skipping the reflectors 402a', 402b'). Note that the use of four reflectors to provide 0°, 90°, 180°, and 270° of phase shifting is for illustration only. Any number of reflectors may be used here to provide different amounts of phase changes to the RF input signal 108.

Although FIG. 5 illustrates one specific example of an implementation of a non-reciprocal circulator-based circuit 500 supporting wideband reconfigurable phase shifting, various changes may be made to FIG. 5. For example, the non-reciprocal circulator 102 may have any suitable number of ports 106 and be coupled to any suitable number of reflective circuit elements, and each reflective circuit element may include any suitable type(s) of phase change or shift reflector(s). Also, it is possible for some of the reflective circuit element to include non-phase-related components. In addition, various components in FIG. 5 may be combined, further subdivided, replicated, omitted, or rearranged and additional components may be added according to particular needs.

Figure 6A:
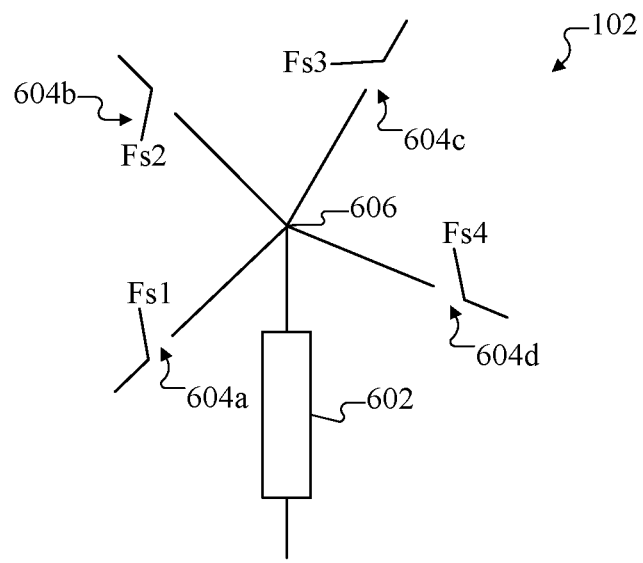
FIGS. 6A and 6B illustrate an example non-reciprocal circulator and its operation according to this disclosure.
Figure 6B:
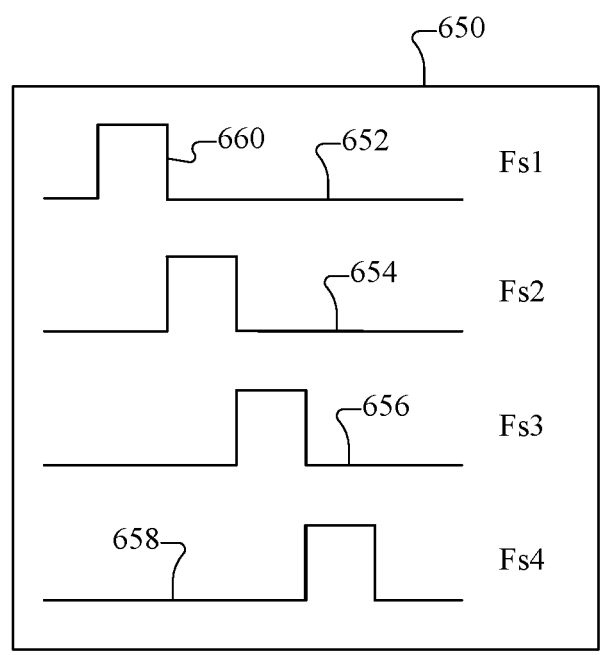

FIGS. 6A and 6B illustrate an example non-reciprocal circulator 102 and its operation according to this disclosure. Note that the same type of structure and operation may be used for each of the non-reciprocal circulators 102a-102b discussed above. As shown in FIG. 6A, the non-reciprocal circulator 102 includes at least one energy storage device 602 and multiple switches 604a-604d coupled to a common node 606. The energy storage device 602 includes any suitable structure configured to store and release electromagnetic energy, such as one or more capacitors or inductors (like one or more high-Q capacitors or inductors). Each switch 604a-604d is configured to be closed (become conductive) and opened (become non-conductive) in order to selectively allow passage of an RF signal through the switch. For example, the switch 604a may be closed to provide the RF input signal 108 to the common node 606. One or more of the switches 604b-604c may be closed to provide an RF signal from the common node 606 to one or more reflective circuit elements 104a-104n. The switch 604d may be closed to provide the RF output signal 110 from the common node 606. Each switch 604a-604d includes any suitable structure configured to selectively form and block an electrical connection, such as a FET or other transistor.

Note that while the non-reciprocal circulator 102 here includes four switches 604a-604d, this is for illustration only. The non-reciprocal circulator 102 may include less than four or more than four switches 604a-604d depending on the implementation. For instance, the non-reciprocal circulator 102 may include one switch for receiving the RF input signal 108, one switch for providing the RF output signal 110, and one switch for each reflective circuit element 104a-104n coupled to the non-reciprocal circulator 102.

As shown in FIG. 6B, a timing diagram 650 illustrates example operation of the switches 604a-604d of the non-reciprocal circulator 102. Here, the timing diagram 650 includes a line 652 representing a control signal Fs1 for the switch 604a, a line 654 representing a control signal Fs2 for the switch 604b, a line 656 representing a control signal Fs3 for the switch 604c, and a line 658 representing a control signal Fs4 for the switch 604d. Each control signal includes pulses 660 that define when the associated switches 604a-604d are conductive.

As can be seen here, the pulses 660 in the control signals occur sequentially. In other words, the pulses 660 in the different control signals are not overlapping with one another, so only one of the switches 604a-604d is conductive at any given time. The sequential use of the pulses 660 in the control signals allows for the transport of the RF signals through the non-reciprocal circulator 102 in a circular manner. In some embodiments, the pulses 660 occur in this sequential manner during a repeating time interval, where the period of the interval is denoted Ts. Here, each pulse 660 may have a duration defined as Ts/N, where N represents the number of switches 604a-604d that are actively being used to pass the RF input signal 108 to the desired reflective circuit element(s) 104a-104n and to output the RF output signal 110. Also, the energy storage device 602 here may create a reflection at a frequency of N×Fs, where Fs denotes the frequency of the RF input signal 108.

It should be noted that it is possible to reconfigure the circulation of RF signals through the non-reciprocal circulator 102 by changing the sequence of the sequential pulses 660 in the control signals. As a result, the branch or branches of a circuit to and from the non-reciprocal circulator 102 that are followed by an RF signal during processing can be changed by adjusting the sequence of the sequential pulses 660 in the control signals. The sequence of the sequential pulses 660 in the control signals may be controlled in any suitable manner, such as by using a processor or other control device.

The non-reciprocal circulator 102 may be implemented in any suitable manner using any suitable materials. For example, in some embodiments, a ferrite-based non-reciprocal circulator 102 may be implemented using single-junction or multi junction approaches, using self biased hexaferrite, or using a lumped element. In other embodiments, an electronic-based non-reciprocal circulator 102 may be implemented using spatio-temporal modulation, be switch-based, or be implemented using sequentially-switched delay lines. An electronic-based non-reciprocal circulator 102 may support N-way or N-path designs and represent a quasi-circulator or an active circulator. An electronic-based non-reciprocal circulator 102 may support linear time-varying operation or operate as an active or passive mixer. Still other embodiments of the non-reciprocal circulator 102 may be based on bulk acoustic wave devices, spin wave/topological insulators, or Josephson junctions. In addition, embodiments of the non-reciprocal circulator 102 may be single-ended or differential.

Although FIGS. 6A and 6B illustrate one example of a non-reciprocal circulator 102 and its operation, various changes may be made to FIGS. 6A and 6B. For example, the number of switches 604a-604d and associated control signals can vary as needed or desired. As a particular example, if an RF input signal 108 passes through one or some (but not all) of the reflective circuit elements 104a-104n, control signals for the used reflective circuit elements 104a-104n may include sequential pulses, and control signals for the unused reflective circuit elements 104a-104n would include no pulses. Also, any other suitable non-reciprocal circulator may be used in the circuits described in this patent document.

Figure 7:
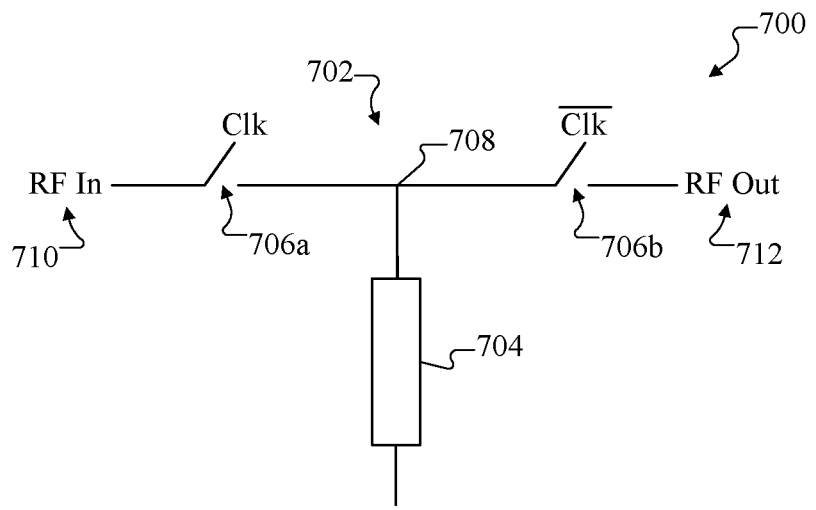
FIG. 7 illustrates an example non-reciprocal circulator-based circuit supporting an isolator function according to this disclosure.

FIG. 7 illustrates an example non-reciprocal circulator-based circuit 700 supporting an isolator function according to this disclosure. As shown in FIG. 7, the circuit 700 includes a non-reciprocal circulator 702 having at least one energy storage device 704 and multiple switches 706a-706b coupled to a common node 708. These components can be the same as or similar to corresponding components in FIG. 6A. Here, one switch 706a can be controlled by a clock signal (Clk), and the other switch 706b can be controlled by an inverse of the clock signal ($\overline{Clk}$). When the clock signal has a 50% duty cycle, this results in the switches 706a-706b each being conductive for substantially equal amounts of time. The overall effect here is that an RF input signal 710 can pass through the circuit 700 and be output as an RF output signal 712, while the circuit 700 functions to effectively isolate the component(s) providing the RF input signal 710 from the component(s) receiving the RF output signal 712.

Note that while no reflective circuit elements 104a-104n are shown in FIG. 7, the common node 708 may be selectively coupled to one or more reflective circuit elements 104a-104n via one or more additional switches (such as in the same or similar manner as shown in FIG. 6A). Thus, for example, the circuit 700 may be configured to perform one or more functions using the reflective circuit elements 104a-104n and then reconfigured to function as an isolator (or vice versa) via suitable control of the pulses provided to the switches of the circuit 700. As a particular example, each of the non-reciprocal circulators described above or below in this patent document may be configured to function as an isolator by disconnecting the non-reciprocal circulator from its associated reflective circuit elements and operating two switches of the non-reciprocal circulator as shown in FIG. 7. Note, however, that this is not necessarily required, and the non-reciprocal circulator 702 may not be coupled to any reflective circuit elements.

Although FIG. 7 illustrates one example of a non-reciprocal circulator-based circuit 700 supporting an isolator function, various changes may be made to FIG. 7. For example, the non-reciprocal circulator 702 may have any suitable number of ports and be coupled to any suitable number of reflective circuit elements 104a-104n (including no reflective circuit elements), and each reflective circuit element 104a-104n may include any suitable type(s) of component(s). In addition, various components in FIG. 7 may be combined, further subdivided, replicated, omitted, or rearranged and additional components may be added according to particular needs.

Figure 8A:
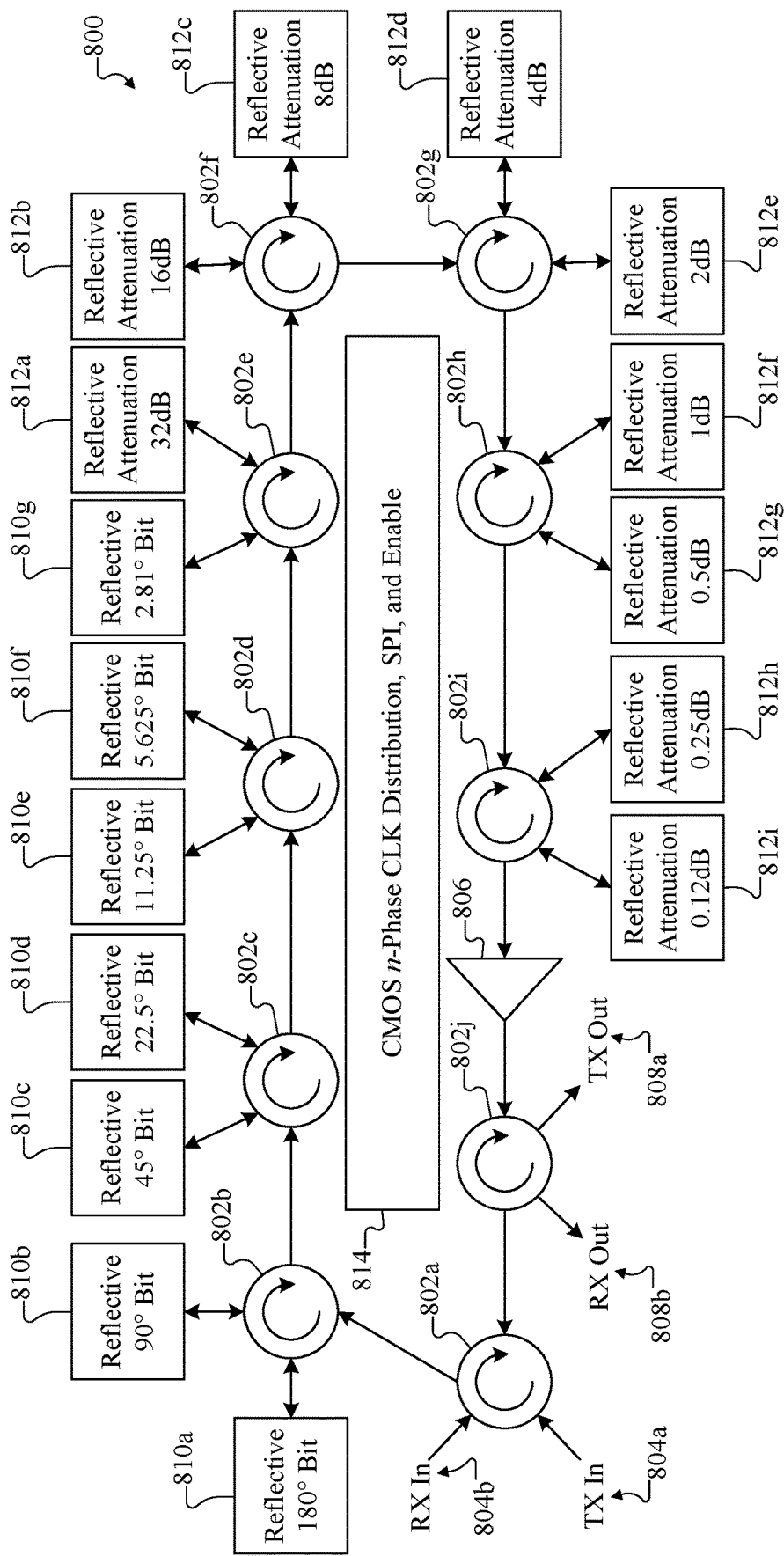
FIGS. 8A through 8D illustrate an example architecture supporting a non-reciprocal circulator-based transceiver according to this disclosure.

FIGS. 8A through 8D illustrate an example architecture 800 supporting a non-reciprocal circulator-based transceiver according to this disclosure. As shown in FIG. 8A, the architecture 800 includes a sequence of non-reciprocal circulators 802a-802j that are coupled together in series, where each of the non-reciprocal circulators 802a-802j may operate in the same or similar manner as the non-reciprocal circulators 102, 102a-102b described above. A first of the non-reciprocal circulators 802a is configured to receive either a transmit RF input signal 804a or a receive RF input signal 804b and to output the received signal to the next non-reciprocal circulator 802b. A non-reciprocal circulator 802i is configured to provide an RF signal to an amplifier 806, which amplifies the RF signal. The amplified RF signal is provided to a final non-reciprocal circulator 802j and output as either a transmit RF output signal 808a or a receive RF output signal 808b.

The RF input signal 804a or 804b here may be modified using various reflective circuit elements 810a-810g and/or various reflective circuit elements 812a-812i. Here, the reflective circuit elements 810a-810g represent different phase delay elements and are configured to provide different amounts of phase delay to the RF input signal 804a or 804b. Also, the reflective circuit elements 812a-812i represent different attenuation elements and are configured to attenuate the RF input signal 804a or 804b by different amounts. The non-reciprocal circulators 802b-802i can be used in the same manner described above to route the RF input signal 804a or 804b through one or more of the reflective circuit elements 810a-810g and/or through one or more of the reflective circuit elements 812a-812i as needed in order to provide one or more desired phase changes and/or one or more desired attenuations to the RF input signal 804a or 804b when generating the RF output signal 808a or 808b.

A control system 814 can be used to control various operations in the architecture 800. For example, the control system 814 can generate and output multi-phase clock signals used to control the non-reciprocal circulators 802a-802j, such as four-phase clock signals used with four-port non-reciprocal circulators. The control system 814 can also interact with other components over a serial peripheral interface (SPI) or other interface. The control system 814 can further generate signals that enable or disable various components in the architecture 800. The control system 814 includes any suitable structure configured to control operation of the architecture 800, such as one or more microprocessors, microcontrollers, digital signal processors (DSPs), application specific integrated circuits (ASICs), field programmable gate arrays (FPGAs), or discrete circuitry.

In the architecture 800, all paths/branches for the RF signals can be controlled via the control system 814, and a path or branch can be selected or skipped using suitable pulses or a lack thereof for switches in the non-reciprocal circulators 802a-802j. Most of the components in the architecture 800 can be low-voltage components, and the amplifier 806 can be used for both transmit and receive purposes. Every path or branch may inherently have a large minimum isolation (such as about 15 dB to about 20 dB or more), which can simplify impedance matching and reduce or prevent impedance pulling between bits in incoming or outgoing data. The reflective phase shifter and attenuator functions may be less lossy compared to their "thru mode" counterparts. In some cases, all digital components of the architecture 800 may be fabricated using complementary metal oxide semiconductor (CMOS) technology. All clock harmonics can be out-of-band and thus easily filtered, and the architecture 800 can operate in a highly linear manner. In addition, the transmit and receive paths here are completely shared and can be easily selectable depending on particular needs at any given time.

Figure 8B:
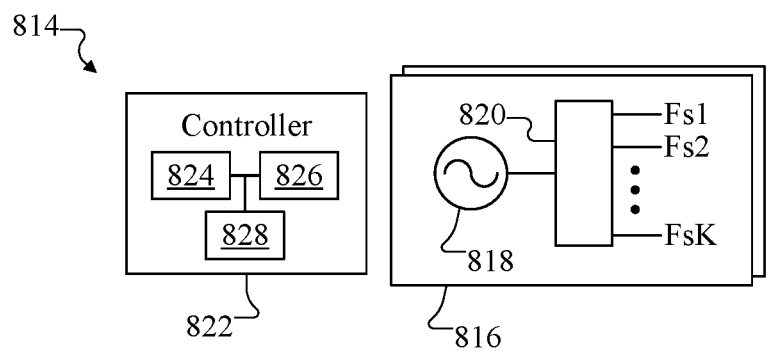

FIG. 8B illustrates a portion of one example implementation of the control system 814. As shown in FIG. 8B, the control system 814 may include at least one clock source 816, which can be used to generate non-overlapping control signals for the switches of the non-reciprocal circulators 802a-802j. Depending on the implementation, each non-reciprocal circulator 802a-802j may have its own clock source 816, or a clock source 816 may be shared between at least two of the non-reciprocal circulators 802a-802j. In each clock source 816, an oscillator 818 operating at a desired frequency can be used to generate a clock signal, and a clock divider 820 (such as a CMOS clock divider) can be used to generate non-overlapping control signals for the associated non-reciprocal circulator(s) 802a-802j.

At least one controller 822 may be used to control the operation of the clock source(s) 816 and possibly other components of the architecture 800. For example, the controller 822 may receive various information (such as measurements of the power or other characteristics of the transmit RF output signal 808a or the receive RF output signal 808b) and control the operation of the clock source(s) 816 based on the information. As a particular example, the controller 822 may cause the frequency of each clock source 816 to sweep over a desired frequency range, such as about 2 GHz to about 18 GHz or some other suitable frequency range. This may be used, for example, to help sense and combat blocker signals. The controller 822 can also or alternatively be used to control the generation of the sequential pulses in the control signals from the clock source(s) 816. For instance, the controller 822 can determine which of the reflective circuit elements 810a-810g, 812a-812i should be used to process the RF input signal 804a or 804b at a given time, and the controller 822 may control the operation of the clock divider(s) 820 in the clock source(s) 816 to produce the desired sequential pulses for the switches of the non-reciprocal circulators 802a-802j. Depending on the implementation, each non-reciprocal circulator 802a-802j or clock source 816 may have its own controller 822, or a controller 822 may be shared between at least two of the non-reciprocal circulators 802a-802j or clock sources 816.

Each controller 822 includes any suitable structure configured to control operation of one or more components of the architecture 800, such as by controlling generation of control signals by the clock divider(s) 820. For instance, the controller 822 may include one or more processing devices 824, such as one or more microprocessors, microcontrollers, DSPs, ASICs, FPGAs, or discrete logic devices. The controller 822 may also include one or more memories 826, such as a random access memory, read only memory, hard drive, Flash memory, optical disc, or other suitable volatile or non-volatile storage device(s). The controller 822 may further include one or more interfaces 828 that support communications with other systems or devices, such as a network interface card or a wireless transceiver facilitating communications over a wired or wireless network or a direct connection.

Figure 8C:
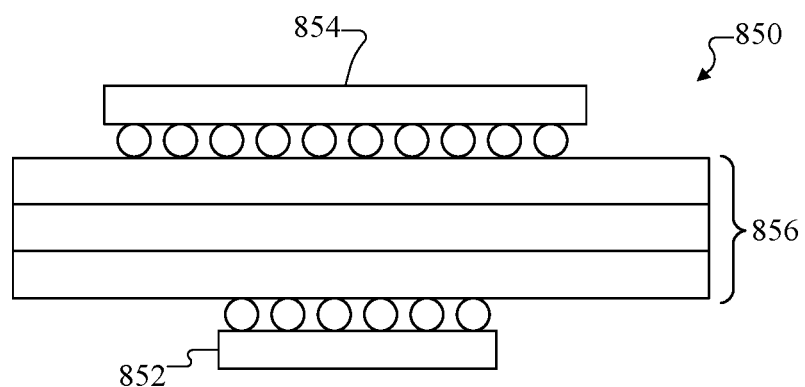
Figure 8D:
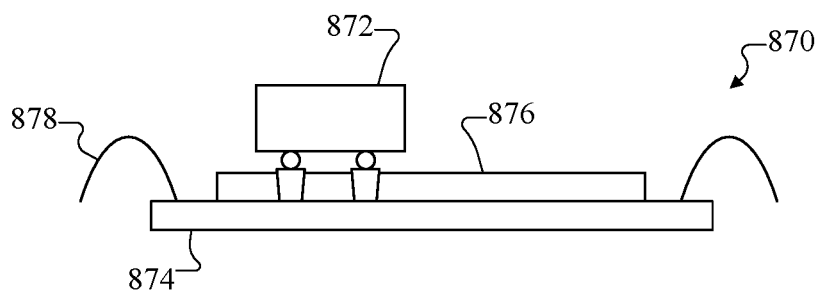

FIGS. 8C and 8D illustrate example layouts 850, 870 of the architecture 800. In FIG. 8C, a first integrated circuit chip 852 may include CMOS components of the architecture 800, and a second integrated circuit chip 854 may include other components of the architecture 800. In some embodiments, the integrated circuit chip 852 may be silicon-based, and the integrated circuit chip 854 may be GaN-based. A multi-layer high-frequency laminate 856 can be used to couple the integrated circuit chips 852, 854 and allow the transport of signals between the integrated circuit chips 852, 854.

In FIG. 8D, a first integrated circuit chip 872 may include CMOS components of the architecture 800, and a second integrated circuit chip 874 may include other components of the architecture 800. In some embodiments, the integrated circuit chip 872 may be silicon-based, and the integrated circuit chip 874 may be a benzocyclobutene (BCB)-based monolithic microwave integrated circuit (MIMIC). An interposer 876, such as a printed circuit board, can be used to couple the integrated circuit chips 872, 874 and allow the transport of signals between the integrated circuit chips 872, 874. One or more I/O lines 878 can be used to provide signals to or receive signals from the integrated circuit chip 874.

Although FIGS. 8A through 8D illustrate one example of an architecture 800 supporting a non-reciprocal circulator-based transceiver, various changes may be made to FIGS. 8A through 8D. For example, any other suitable architecture may use one or more non-reciprocal circulator-based circuits to perform one or more desired functions. Also, any other suitable layouts may be used to implement the architecture 800. In addition, various components in each figure may be combined, further subdivided, replicated, omitted, or rearranged and additional components may be added according to particular needs.

Figure 9:
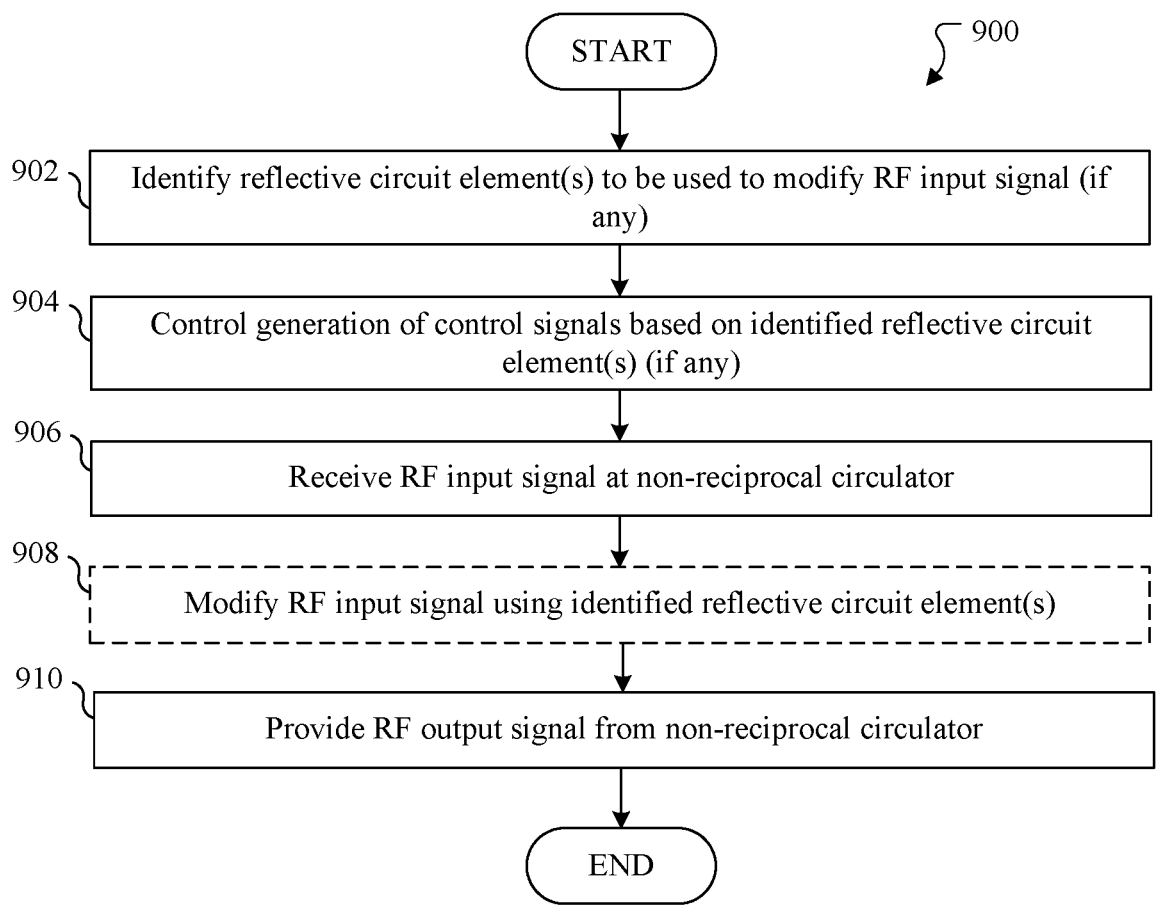
FIG. 9 illustrates an example method for using a reconfigurable wideband high-frequency circuit having a non-reciprocal circulator according to this disclosure.

FIG. 9 illustrates an example method 900 for using a reconfigurable wideband high-frequency circuit having a non-reciprocal circulator according to this disclosure. For ease of explanation, the method 900 is described as being performed using the circuit 100 of FIG. 1, which may be used in a larger system such as the architecture 800 of FIG. 8A. However, the method 900 may be performed using any suitable device and in any suitable system.

As shown in FIG. 9, one or more reflective circuit elements to be used to modify an RF input signal are identified (if any) at step 902. This may include, for example, the control system 814, controller 822, or other component identifying one or more reflective circuit elements 104a-104n to be used to modify an RF input signal 108. This may occur in various ways depending on the implementation. For instance, a sequence of reflective circuit elements 104a-104n may be used in series during a sweep of a frequency range, or modifications provided by the reflective circuit elements 104a-104n may be used to select one or more of the reflective circuit elements 104a-104n that would provide a desired modification. Note that "if any" is indicated here since, in some cases, an isolation function may be needed or desired, rather than another signal processing operation that involves the use of one or more reflective circuit elements 104a-104n.

Generation of control signals is controlled based on the one or more identified reflective circuit elements (if any) at step 904. This may include, for example, the control system 814, controller 822, or other component controlling the clock source(s) 816 in order to generate sequential pulses in control signals provided to switches of at least one non-reciprocal circulator 102. The pulses in these control signals control whether the RF input signal 108 will pass through none, one, some, or all of the reflective circuit elements 104a-104n (depending on the specific requirements).

The RF input signal is received at the non-reciprocal circulator at step 908 and optionally modified using the one or more identified reflective circuit elements (if any) at step 910. This may include, for example, the non-reciprocal circulator 102 passing the RF input signal 108 to one of the reflective circuit elements 104a-104n and receiving a modified RF signal from that reflective circuit element. This may also include the non-reciprocal circulator 102 passing the modified RF signal to another of the reflective circuit elements 104a-104n and receiving a twice-modified RF signal from that reflective circuit element. This may occur any number of times based on the number of identified reflective circuit elements 104a-104n being used to modify the RF input signal 108. If an isolator function is being implemented, the RF input signal 108 may be provided to no reflective circuit elements. An RF output signal is provided from the non-reciprocal circulator at step 910. This may include, for example, the non-reciprocal circulator 102 outputting the RF output signal 110, which represents the RF input signal 108 as modified by the non-reciprocal circulator 102 and optionally at least one of the reflective circuit elements 104a-104n.

Although FIG. 9 illustrates one example of a method 900 for using a reconfigurable wideband high-frequency circuit having a non-reciprocal circulator, various changes may be made to FIG. 9. For example, while shown as a series of steps, various steps in FIG. 9 may overlap, occur in parallel, occur in a different order, or occur any number of times. As a particular example, the reflective circuit elements 104a-104n identified and used during signal modification can change over time, such as during a frequency sweep or in between intermittent isolator operations.

It should be noted that while different circuits have been described above, a combination of features from the different circuits may be used together as needed or desired. For example, a circuit may include at least one non-reciprocal circulator 102 and multiple reflective circuit elements 104a-104n, where the reflective circuit elements 104a-104n include phase delay elements, attenuation elements, and/or other types of reflective circuit elements (or any combination thereof). While one particular example of this is shown in the architecture 800 of FIG. 8A since it includes both phase shifters and attenuators, other combinations of reflective circuit elements may be used in any given circuit or architecture. As another example, one or more clock sources 816 may be used in any of the circuits 100, 200, 300, 400, 500, 700 to generate control signals for the non-reciprocal circulators 102, 102a-102b, 702, and the controller 822 may be used in any of the circuits 100, 200, 300, 400, 500, 700 to adjust control signals for the non-reciprocal circulators 102, 102a-102b, 702. Thus, any feature shown in one or more figures described above may be used in the circuit of another figure described above as needed or desired.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive (HDD), a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
   at least one non-reciprocal circulator; and
   one or more reflective circuit elements, each reflective circuit element configured to receive a radio frequency (RF) signal from the at least one non-reciprocal circulator and to provide a modified RF signal to the at least one non-reciprocal circulator;
   wherein each non-reciprocal circulator comprises (i) multiple switches coupled to a common node of the non-reciprocal circulator and (ii) at least one energy storage device coupled to the common node of the non-reciprocal circulator.

2. The system of claim 1, wherein:
   the one or more reflective circuit elements comprise phase change reflectors configured to modify a phase of the RF signal; and
   the at least one non-reciprocal circulator and the phase change reflectors form a wideband reconfigurable phase shifter.

3. The system of claim 2, wherein:
   the phase change reflectors comprise multiple reference phase change reflectors and multiple phase shift reflectors; and
   different pairs of one reference phase change reflector and one phase shift reflector are configured to provide different amounts of phase shift.

4. The system of claim 1, wherein:
   the at least one non-reciprocal circulator comprises first and second non-reciprocal circulators;
   the one or more reflective circuit elements comprise a first reflective phase delay element coupled to the first non-reciprocal circulator and a second reflective phase delay element coupled to the second non-reciprocal circulator; and
   the non-reciprocal circulators and the reflective phase delay elements form a balun.

5. The system of claim 1, wherein:
   the one or more reflective circuit elements form multiple circuit branches;
   the at least one non-reciprocal circulator is configured to receive an RF input signal and provide an RF output signal, the RF output signal representing the RF input signal as modified by at least one of the one or more reflective circuit elements; and
   at least one of the circuit branches is configured to be selectively used to generate the RF output signal.

6. The system of claim 1, wherein the at least one non-reciprocal circulator comprises:
   a first set of one or more non-reciprocal circulators coupled to a first type of reflective circuit element; and
   a second set of one or more non-reciprocal circulators coupled to a second type of reflective circuit element; and
   wherein the non-reciprocal circulators of the first and second sets are coupled together in series.

7. A system comprising:
   at least one non-reciprocal circulator; and
   one or more reflective circuit elements, each reflective circuit element configured to receive a radio frequency (RF) signal from the at least one non-reciprocal circulator and to provide a modified RF signal to the at least one non-reciprocal circulator;
   wherein each non-reciprocal circulator comprises multiple switches; and
   wherein the switches of each non-reciprocal circulator are configured to be controlled using non-overlapping pulses in respective control signals.

8. The system of claim 7, wherein the system is reconfigurable based on changing a sequence of the non-overlapping pulses in the control signals.

9. A system comprising:
   at least one non-reciprocal circulator; and
   one or more reflective circuit elements, each reflective circuit element configured to receive a radio frequency (RF) signal from the at least one non-reciprocal circulator and to provide a modified RF signal to the at least one non-reciprocal circulator;
   wherein each non-reciprocal circulator is configurable to operate as an isolator in which the non-reciprocal circulator is not conductively coupled to any reflective circuit elements during operation as the isolator.

10. A non-transitory computer readable medium containing instructions that when executed cause at least one controller to:
    reconfigure a system comprising at least one non-reciprocal circulator and multiple reflective circuit elements, each reflective circuit element configured to receive a radio frequency (RF) signal from the at least one non-reciprocal circulator and to provide a modified RF signal to the at least one non-reciprocal circulator;

wherein the instructions that cause the at least one controller to reconfigure the system comprise instructions that cause the at least one controller to change a sequence of non-overlapping pulses in control signals provided to multiple switches of each non-reciprocal circulator in order to selectively control which of the reflective circuit elements is conductively coupled to the at least one non-reciprocal circulator.

11. The non-transitory computer readable medium of claim 10, wherein the instructions that cause the at least one controller to change the sequence of non-overlapping pulses in the control signals provided to the switches of each non-reciprocal circulator comprise:

instructions that cause the at least one controller to change the sequence of non-overlapping pulses in the control signals provided to the switches of each non-reciprocal circulator in order to vary which of the reflective circuit elements is conductively coupled to the at least one non-reciprocal circulator during operation.

12. The non-transitory computer readable medium of claim 10, wherein:

the reflective circuit elements form multiple circuit branches; and the instructions that cause the at least one controller to change the sequence of non-overlapping pulses in the control signals provided to the switches of each non-reciprocal circulator comprise:

instructions that cause the at least one controller to change the sequence of non-overlapping pulses in the control signals provided to the switches of each non-reciprocal circulator in order to vary which of the circuit branches is used to modify an RF input signal and generate an RF output signal.

13. A method comprising:

receiving a radio frequency (RF) input signal using at least one non-reciprocal circulator; and generating an RF output signal using at least one of one or more reflective circuit elements, each reflective circuit element configured to receive an RF signal from the at least one non-reciprocal circulator and to provide a modified RF signal to the at least one non-reciprocal circulator;

wherein the RF output signal represents the RF input signal as modified by the at least one of the one or more reflective circuit elements; and wherein each non-reciprocal circulator comprises (i) multiple switches coupled to a common node of the non-reciprocal circulator and (ii) at least one energy storage device coupled to the common node of the non-reciprocal circulator.

14. The method of claim 13, wherein:

the one or more reflective circuit elements comprise phase change reflectors configured to modify a phase of the RF signal; and the at least one non-reciprocal circulator and the phase change reflectors form a wideband reconfigurable phase shifter.

15. The method of claim 14, wherein:

the phase change reflectors comprise multiple reference phase change reflectors and multiple phase shift reflectors; and different pairs of one reference phase change reflector and one phase shift reflector are configured to provide different amounts of phase shift.

16. The method of claim 13, wherein:

the at least one non-reciprocal circulator comprises first and second non-reciprocal circulators;

the one or more reflective circuit elements comprise a first reflective phase delay element coupled to the first non-reciprocal circulator and a second reflective phase delay element coupled to the second non-reciprocal circulator; and the non-reciprocal circulators and the reflective phase delay elements form a balun.

17. The method of claim 13, wherein the switches of each non-reciprocal circulator are controlled using non-overlapping pulses in respective control signals.

18. The method of claim 17, further comprising:

reconfiguring a system that includes the at least one non-reciprocal circulator and the one or more reflective circuit elements by changing a sequence of the non-overlapping pulses in the control signals.

19. The method of claim 13, wherein:

the one or more reflective circuit elements form multiple circuit branches; and one or more of the circuit branches are selectively used to generate the RF output signal.

20. The method of claim 13, further comprising:

configuring the at least one non-reciprocal circulator to operate as an isolator, wherein each non-reciprocal circulator operating as an isolator is not conductively coupled to any reflective circuit elements during operation as the isolator.

* * * * *